US008633839B2

(12) United States Patent
Takano

(10) Patent No.: US 8,633,839 B2
(45) Date of Patent: Jan. 21, 2014

(54) DATA COMPRESSION APPARATUS BY A PLURALITY OF TYPES OF ALGORITHMS AND A METHOD

(75) Inventor: Nobuhiro Takano, Machida (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/613,490

(22) Filed: Sep. 13, 2012

(65) Prior Publication Data
US 2013/0088373 A1 Apr. 11, 2013

(30) Foreign Application Priority Data
Oct. 7, 2011 (JP) ................................. 2011-222836

(51) Int. Cl.
*H03M 7/30* (2006.01)
(52) U.S. Cl.
USPC .................. 341/87; 341/67; 341/65; 341/78; 711/161; 348/839; 348/E5.133; 375/E7.088; 375/E7.158; 375/E7.13; 709/203; 707/692; 707/999.2; 707/999.204; 707/E17.01; 714/6.23; 714/6.32; 714/E11.123; 714/E11.125
(58) Field of Classification Search
USPC ............ 341/51–87; 707/692, 999.2, 999.204, 707/E17.01; 709/203; 714/6.23, 6.32, 714/E11.123, E11.125; 375/E7.008, E7.13, 375/E7.158; 711/161; 348/839, E5.133, 348/207.99
See application file for complete search history.

(56) References Cited

U.S. PATENT DOCUMENTS

| 5,249,053 | A * | 9/1993 | Jain ........................... 348/207.99 |
| 6,661,839 | B1 * | 12/2003 | Ishida et al. .................. 375/240 |
| 7,483,929 | B2 * | 1/2009 | Kulkarni et al. ...................... 1/1 |
| 7,492,290 | B1 * | 2/2009 | Schneider ....................... 341/67 |
| 7,506,010 | B2 * | 3/2009 | Kulkarni et al. ...................... 1/1 |
| 7,817,069 | B2 * | 10/2010 | Schneider ....................... 341/60 |
| 2012/0268298 | A1 * | 10/2012 | Oh .................................. 341/87 |
| 2013/0166861 | A1 * | 6/2013 | Takano et al. ................. 711/161 |

FOREIGN PATENT DOCUMENTS

| JP | 7-210324 A | 8/1995 |
| JP | 2004-13243 A | 1/2004 |
| WO | WO 2004/111794 A2 | 12/2004 |

OTHER PUBLICATIONS

European Search Report mailed Oct. 29, 2013 for corresponding European Patent Application No. EP 12 18 5655.

* cited by examiner

*Primary Examiner* — Lam T Mai
(74) *Attorney, Agent, or Firm* — Fujitsu Patent Center

(57) ABSTRACT

A size comparison unit reports, to an access control unit, the size of a piece of compressed data having the smallest size from among pieces of compressed data generated via compression processing units compressing blocks, an algorithm name representing a compression processing unit that has generated the piece of compressed data having the smallest size; the access control unit selects a piece of compressed data to be written in a tape medium and reports, to a statistical information processing unit, an algorithm name representing a compression processing unit that has generated this selected piece of compressed data; the statistical information processing unit extracts, from the reported algorithm name, a regularity present in a result of the selection of compressed data and, in accordance with this extracted regularity, specifies and stops a compression processing unit to be stopped.

7 Claims, 9 Drawing Sheets

FIG. 1A

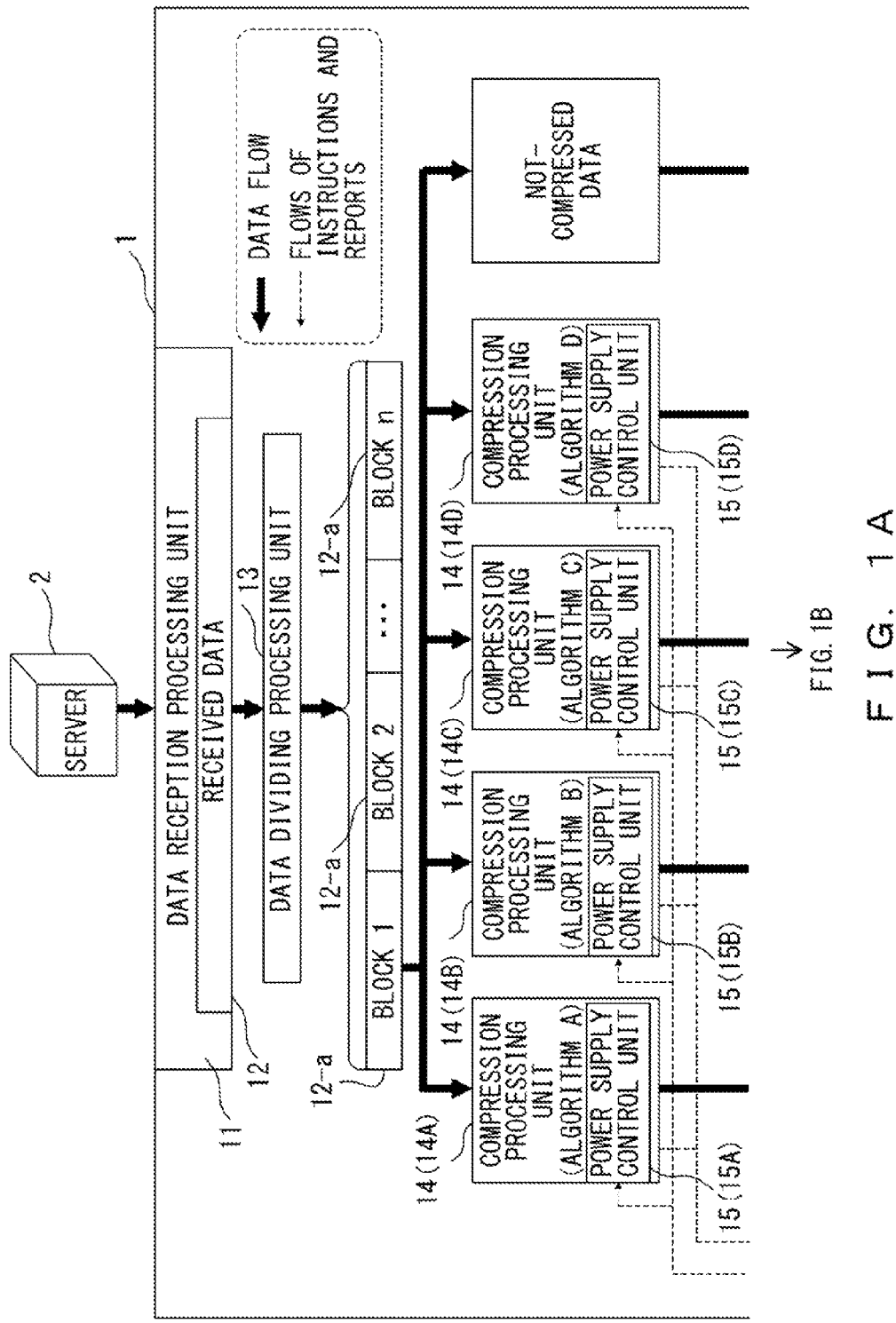

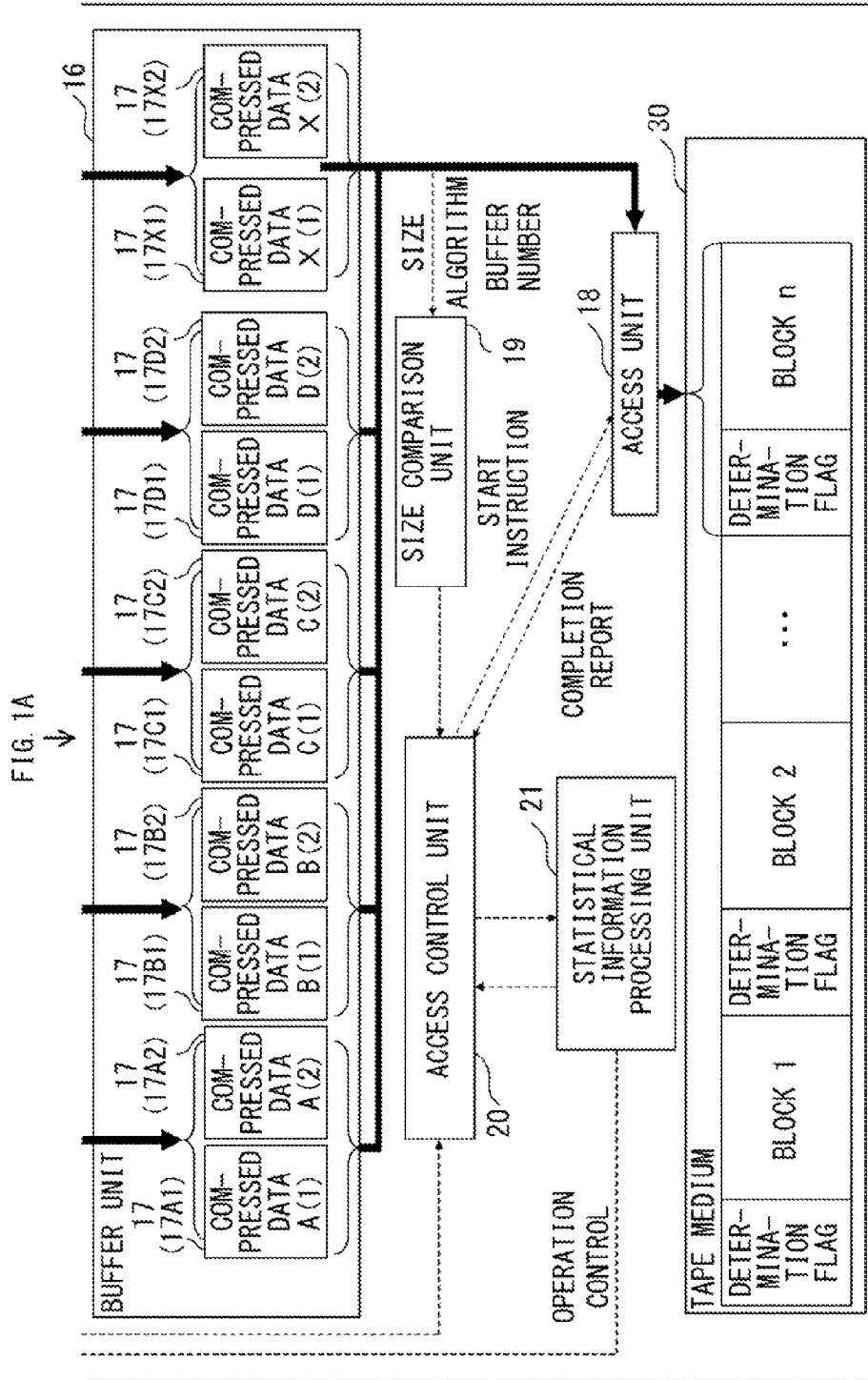

| OBJECT BLOCK | COMPRESS-IBILITY (%) | COMPRES-SION TIME(s) | ALGORITHM | | | |
|---|---|---|---|---|---|---|
| | | | A | B | C | D |
| 1 | 200 | 10 | ○ | × | × | × |
| 2 | 190 | 10 | × | ○ | × | × |
| 3 | 200 | 10 | ○ | × | × | × |
| 4 | 210 | 10 | ○ | × | × | × |
| 5 | 200 | 10 | ○ | × | × | × |
| 6 | 120 | 5 | × | ○ | × | × |
| 7 | 200 | 10 | ○ | × | STOP 1 | STOP 1 |
| 8 | 200 | 10 | ○ | × | STOP 2 | STOP 2 |
| 9 | 200 | 10 | ○ | × | STOP 3 | STOP 3 |
| 10 | 210 | 10 | ○ | × | STOP 4 | STOP 4 |
| 11 | 200 | 10 | ○ | × | STOP 5 | STOP 5 |
| 12 | 210 | 10 | ○ | × | STOP 6 | STOP 6 |
| 13 | 200 | 10 | ○ | STOP 1 | × | × |
| 14 | 210 | 10 | ○ | STOP 2 | × | × |
| 15 | 200 | 10 | ○ | STOP 3 | STOP 1 | STOP 1 |
| 16 | 210 | 10 | ○ | STOP 4 | STOP 2 | STOP 2 |
| 17 | 120 | 10 | ○ | STOP 5 | STOP 3 | STOP 3 |
| 18 | 170 | 8 | × | ○ | × | × |
| 19 | 170 | 8 | × | ○ | × | × |
| 20 | 170 | 8 | × | ○ | × | × |
| 21 | 170 | 8 | × | ○ | × | × |
| 22 | 170 | 8 | × | ○ | × | × |
| 23 | 170 | 8 | × | ○ | × | × |
| 24 | 170 | 8 | STOP 1 | ○ | STOP 1 | STOP 1 |
| 25 | 170 | 8 | STOP 2 | ○ | STOP 2 | STOP 2 |
| 26 | 170 | 8 | STOP 3 | ○ | STOP 3 | STOP 3 |
| 27 | 170 | 8 | STOP 4 | ○ | STOP 4 | STOP 4 |
| 28 | 170 | 8 | STOP 5 | ○ | STOP 5 | STOP 5 |
| 29 | 170 | 8 | STOP 6 | ○ | STOP 6 | STOP 6 |
| 30 | 170 | 8 | × | ○ | × | × |
| 31 | 160 | 7 | × | × | ○ | × |
| 32 | 170 | 10 | STOP 1 | ○ | × | STOP 1 |
| 33 | 170 | 10 | STOP 2 | ○ | × | STOP 2 |
| 34 | 170 | 10 | STOP 3 | ○ | × | STOP 3 |
| 35 | 170 | 10 | STOP 4 | ○ | × | STOP 4 |
| 36 | 170 | 10 | STOP 5 | ○ | × | STOP 5 |
| 37 | 170 | 10 | STOP 6 | ○ | × | STOP 6 |

F I G. 5

| OBJECT BLOCK | COMPRESS-IBILITY (%) | COMPRES-SION TIME (s) | ALGORITHM ||||
|---|---|---|---|---|---|---|
| | | | A | B | C | D |
| 1 | 200 | 10 | ○ | × | × | × |
| 2 | 150 | 7 | × | ○ | × | × |
| 3 | 200 | 10 | ○ | × | × | × |
| 4 | 150 | 7 | × | ○ | × | × |
| 5 | 200 | 10 | ○ | × | × | × |
| 6 | 150 | 7 | × | ○ | × | × |
| 7 | 200 | 10 | ○ | × | STOP 1 | STOP 1 |
| 8 | 150 | 7 | × | ○ | STOP 2 | STOP 2 |
| 9 | 200 | 10 | ○ | × | STOP 3 | STOP 3 |
| 10 | 150 | 7 | × | ○ | STOP 4 | STOP 4 |
| 11 | 200 | 10 | ○ | × | STOP 5 | STOP 5 |
| 12 | 150 | 7 | × | ○ | STOP 6 | STOP 6 |
| 13 | 200 | 10 | ○ | STOP | STOP | STOP |
| 14 | 150 | 7 | STOP | ○ | STOP | STOP |
| 15 | 200 | 10 | ○ | STOP | STOP | STOP |
| 16 | 150 | 7 | STOP | ○ | STOP | STOP |
| 17 | 200 | 10 | ○ | STOP | STOP | STOP |
| 18 | 150 | 7 | STOP | ○ | STOP | STOP |
| 19 | 200 | 10 | ○ | STOP | STOP | STOP |
| 20 | 150 | 7 | STOP | ○ | STOP | STOP |
| 21 | 200 | 10 | ○ | STOP | STOP | STOP |
| 22 | 150 | 7 | STOP | ○ | STOP | STOP |
| 23 | 200 | 10 | ○ | STOP | STOP | STOP |
| 24 | 150 | 7 | STOP | ○ | STOP | STOP |
| 25 | 200 | 10 | ○ | × | × | × |
| 26 | 150 | 7 | × | ○ | × | × |
| 27 | 200 | 10 | ○ | × | × | × |
| 28 | 150 | 7 | ○ | × | × | × |
| 29 | 200 | 10 | ○ | × | × | × |
| 30 | 200 | 10 | ○ | × | × | × |
| 31 | 200 | 10 | ○ | × | STOP 1 | STOP 1 |
| 32 | 200 | 10 | ○ | × | STOP 2 | STOP 2 |
| 33 | 200 | 10 | ○ | STOP 1 | STOP 3 | STOP 3 |
| 34 | 200 | 10 | ○ | STOP 2 | STOP 4 | STOP 4 |
| 35 | 200 | 10 | ○ | STOP 3 | STOP 5 | STOP 5 |
| 36 | 200 | 10 | ○ | STOP 4 | STOP 6 | STOP 6 |
| 37 | 200 | 10 | ○ | STOP 5 | × | × |

FIG. 6

DATA COMPRESSION APPARATUS BY A PLURALITY OF TYPES OF ALGORITHMS AND A METHOD

CROSS-REFERENCE TO RELATED APPLICATION

This application is based upon and claims the benefit of priority of the prior Japanese Patent Application No. 2011-222836, filed on Oct. 7, 2011, the entire contents of which are incorporated herein by reference.

FIELD

The embodiments discussed herein are related to a data compression apparatus and a data compression method.

BACKGROUND

Currently, data compression technologies have been widely adopted for applications such as shortening of the time required to transmit or receive data and the reduction of the size of a storage region required for storage. Accordingly, data compression apparatuses which compress data have been widely applied to, for example, a communication system that is capable of transmitting data and a data storage apparatus that stores data on a storage medium.

There are many algorithms for data compression, and compressibility changes depending on a data content and an algorithm. Accordingly, when pieces of data including the same content are compressed, compressibility typically changes in accordance with an algorithm. Assume that compressibility (%) indicates the value calculated as follows.

$$\text{Compressibility} = (\text{amount of data before compression} / \text{amount of data after compression}) \times 100 \quad (1)$$

The compressibility calculated in this way indicates a higher value as the compression becomes more effective, i.e., as the compression efficiency becomes higher. A compression efficiency (or compressibility) changes depending on a data content and an algorithm, and hence some conventional data compression apparatuses are provided with a plurality of kinds of data compression functions with different algorithms.

A conventional data compression apparatus provided with a plurality of data compression functions with different algorithms performs data compressions in parallel by using these data compression functions and selects an optimum piece of compressed data from pieces of compressed data obtained by the data compressions. The selection is made with reference to compressibility and a processing speed (i.e., the processing time required for the compression). As a result, such a conventional data compression apparatus selects optimum compressed data in accordance with the compressibility and the processing speed. Conventional data compression apparatuses capable of selecting optimum compressed data in this way may achieve a higher processing speed while maintaining high compressibility.

The data compression functions are each operable as one apparatus (module) so that data compressions can be performed in parallel. Accordingly, the more data compression functions are provided, the greater the power consumption of a data compression apparatus becomes. As a result, for a data compression apparatus provided with a plurality of types of data compression functions, limiting of power consumption should be considered in addition to maintenance of high compressibility and speeding up of a processing speed.

Patent document 1: Japanese Laid-open Patent Publication No. 7-210324
Patent Document 2: Japanese Laid-open Patent Publication No. 2004-13243

SUMMARY

One system to which the present invention has been applied divides data to be compressed into a plurality of divided blocks and compresses each of the divided blocks. Accordingly, the system includes: a plurality of compression processing units each of which compresses a divided block to generate a compressed block in accordance with a different algorithm; a selection unit that selects a compressed block from the compressed blocks generated by the plurality of compression processing units according to at least one of the size of each of the generated compressed blocks and a processing time required to compress each of the generated compressed blocks; a control unit that stops any of the plurality of compression processing units according to a regularity when the pattern of the selection by the selection unit has the regularity.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B illustrate a configuration of a data storage apparatus in accordance with the present embodiment.

FIG. 5 is a diagram (pattern 1) illustrating a stop control applied to each compression processing unit performed by a statistical processing unit.

FIG. 6 is a diagram (pattern 2) illustrating a stop control applied to each compression processing unit performed by a statistical processing unit.

DESCRIPTION OF EMBODIMENTS

Figure 2:
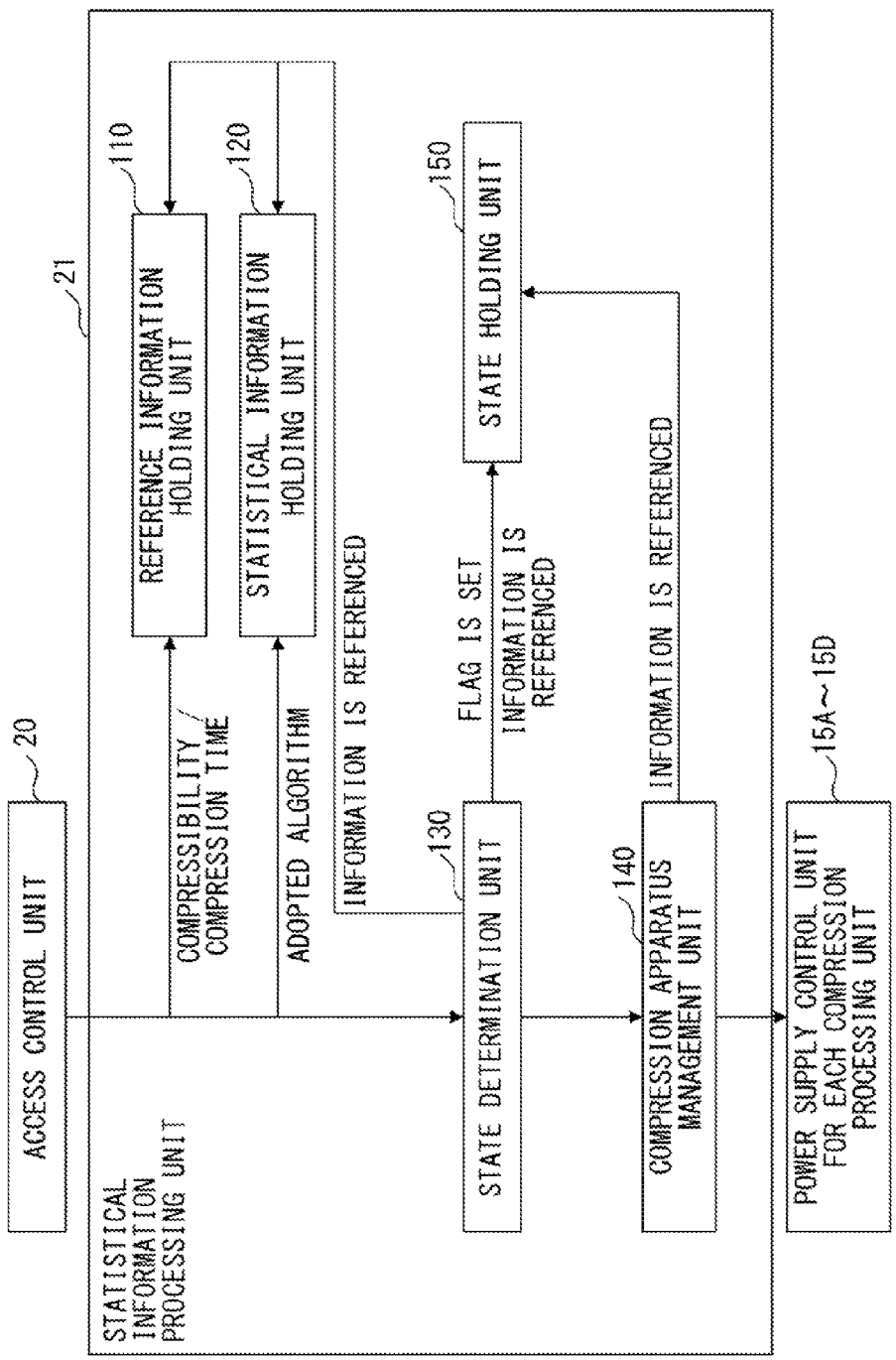
FIG. 2 illustrates a configuration of a statistical information processing unit.

In the following, embodiments of the present invention will be described in detail with reference to the drawings.

FIGS. 1A and 1B illustrate a configuration of a data storage apparatus in accordance with the present embodiment.

A data storage apparatus 1 may obtain data to be stored from an external apparatus such as a server (computer) 2, compress this obtained data, and store data obtained via the compressing on a tape (hereinafter referred to as a "tape medium") 30, which functions as a recording medium. To perform the data compression, the data storage apparatus 1 is provided with a data compression apparatus in accordance with the present embodiment. Accordingly, the data storage apparatus 1 in accordance with the present embodiment is achieved by providing the data compression apparatus in accordance with the present embodiment.

As illustrated in FIGS. 1A and 1B, the data storage apparatus 1 includes a data transmission and reception processing unit 11, a data dividing processing unit 13, four compression processing units 14 (14A to 14D), a buffer unit 16, an access unit 18, a size comparison unit 19, an access control unit 20, a statistical information processing unit 21, and a tape medium 30. These are as follows. In FIGS. 1A and 1B, the solid-line arrows indicate data flows and the dashed-line arrows indicate flows of instructions or reports.

The data storage apparatus 1 is connected to the server 2 via, for example, a cable (not illustrated) or a network (not illustrated). The data transmission and reception processing unit 11 transmits data to or receives data from the server 2 via a cable or a network. Assume that received data 12 received from the server 2 by the data transmission and reception processing unit 11 is data to be stored. Assume that the server 2 is connected via a network.

The amount of data to be stored transmitted from the server 2 is typically huge. Accordingly, the data dividing processing unit 13 divides the received data 12 received by the data transmission and reception processing unit 11 into, for example, blocks 12a, each of which is a piece of data whose size (or data volume) is determine in advance.

"BLOCK 1" in FIGS. 1A and 1B represents a block 12a positioned at the head of received data 12. "1" in "BLOCK 1" represents a block number that is identification data of the block 12a. Accordingly, as an example, "BLOCK 2", having the block number "2", represents a block 12a that is the second block from the head of the received data 12.

The four compression processing units 14 each compress data in accordance with a different algorithm. So that the stopping or the operation can be controlled, the compression processing units 14 (14A to 14D) each include a power supply control unit 15 (15A to 15D). The power supply control unit 15 supplies or stops (blocks) a power supply to the provided compression processing unit 14 in accordance with an instruction from outside. The power supply control unit 15 enables a selection of a compression processing unit 14 to actually be operated from the compression processing units 14. Algorithms employed by the compression processing units 14A to 14D will hereinafter be referred to as "algorithms A to D", respectively, so that correspondences between the compression processing units 14 and the algorithms can be easily recognized.

The algorithms A to D are not particularly limited and may be determined in accordance with an application of the data storage apparatus 1. Examples of lossless compression algorithms include ALDC (Adaptive Lossless Data Compression), DCLZ (Data Compression according to Lempel and Ziv), LIMA (Lempel Ziv Markov chain Algorithm), and Deflate.

Each of the compression processing units 14 performs data compression for each block 12a. As a result of the data compression, compressed data, i.e., the block 12a that has been compressed (or a compressed block), is generated. The buffer unit 16 is used to store compressed data generated by each of the compression processing units 14.

For each of the compression processing units 14, the buffer unit 16 has two storage areas 17 for storage of compressed data. The two rectangular frames 17 (17A1 and 17A2) indicated as "COMPRESSED DATA A(1)" and "COMPRESSED DATA A(2)" in FIGS. 1A and 1B are storage areas dedicated to the compression processing unit 14A. Similarly, the two rectangular frames 17 (17B1 and 17B2) indicated as "COMPRESSED DATA B(1)" and "COMPRESSED DATA B(2)" are storage areas dedicated to the compression processing unit 14B. Two storage areas 17 are dedicated to each of the compression processing units 14 in this way, so that one of the two storage areas can be used to write compressed data and the other can be used to read compressed data. Dedicating two storage areas 17 to each of the compression processing units 14 enables different accesses to the same storage area 17 to be prevented from occurring in parallel. Each of the storage areas 17 has assigned to it, for example, a buffer number as identification data.

Together with compressed data, the compression processing units 14 each store, for example, the data volume (or size) of the compressed data in the storage area 17. The size comparison unit 19 accesses the storage areas 17 in which the compression processing units 14 have written compressed data, reads the sizes (or data volumes) of the compressed data written in the storage areas 17, and compares these read sizes. As a result, the size comparison unit 19 specifies a storage area 17 storing compressed data with the smallest size. The smallest size, the buffer number of the storage area 17 storing the compressed data with the smallest size, identification data indicating a compression processing unit 14 which generated the compressed data with the smallest size, and the like are output to the access control unit 20. Assume that the identification data indicating the compression processing unit 14 is data indicating the name of an algorithm adopted by this compression processing unit 14 (this data will hereinafter be simply referred to as an "algorithm name").

The access unit 18 accesses the tape medium 30. The access control unit 20 controls access from the access unit 18 to the tape medium 30. To store in the tape medium 30 received data 12 that has been compressed, the access control unit 20 determines a storage area 17 that needs to write the compressed data in the tape medium 30, reports an algorithm name and a buffer number to the access unit 18, and gives an instruction to start writing the compressed data. In accordance with this start instruction, the access unit 18 reads, from the buffer unit 16, compressed data stored in the storage area 17 designated by the buffer number and writes this piece of read data to the tape medium 30. The algorithm name is added to the compressed data as a determination flag so that the compressed data can be decompressed. As a result, for each of the blocks 12a, compressed data obtained from a block 12a and a determination flag are written in the tape medium 30. In FIGS. 1A and 1B, compressed data written in the tape medium 30 may represent a correspondence relationship with a compressed block 12a and is represented as, for example, "BLOCK 1" or "BLOCK 2". A method for selecting compressed data will be described hereinafter.

Meanwhile, when no attempt is made to store received data 12 that has been compressed in the tape medium 30, the access control unit 20 reports, to the access unit 18, the buffer number of a storage area 17×1 or 17×2 and an algorithm name and stores a block 12a in the tape medium 30. This algorithm name expresses no compression. Accordingly, when a block 12a is directly written to the tape medium 30, a determination flag is again added to this block 12a.

To store received data 12 that has been compressed in the tape medium 30, the access control unit 20 selects compressed data to be written in the tape medium 30 in accordance with information input from the size comparison unit 19. Accordingly, the access control unit 20 stores compressed data with the smallest size in the tape medium 30.

The statistical information processing unit 21 receives, from the access control unit 20, the result of a selection of compressed data in the form of, for example, an algorithm name adopted by the compression processing unit 14 that has generated the compressed data, statistically processes this result, and extracts a trend (regularity) present in the result of a selection of compressed data made by the access control unit 20. Such a trend may be extracted since a pattern is defined in advance for one compression processing unit 14 and for each of the plurality of the compression processing units 14. Accordingly, in accordance with the result of an adoption (or selection) of compressed data by the access control unit 20, the statistical information processing unit 21 extracts a pattern that is consistent with a connection to the compression processing unit 14 (algorithm name) that has generated the adopted compressed data.

The result of pattern extraction is reflected in a stop control applied to each compression processing unit 14. Accordingly, in the present embodiment, the fact that a pattern is extracted indicates a situation in which the compression processing units 14 include a compression processing unit 14 with compressed data that appears to be unlikely to be selected. As a result, in accordance with the extracted pattern, the statistical information processing unit 21 stops the compression processing unit 14 with compressed data that appears to be unlikely to be selected.

The compression processing unit 14 with compressed data that is not selected is not virtually associated with generating of compressed data. Accordingly, in the present embodiment, the compression processing unit 14 with compressed data that appears to be unlikely to be selected is stopped, thereby maintaining a high probability that optimum compressed data will be generated. Even when the high probability is maintained, the compression processing units 14 will include a stopped compression processing unit 14, thereby decreasing power consumption of the entirety of the set of compression processing units 14. In this way, stopping the compression processing unit 14 with compressed data that appears to be unlikely to be selected enables obtainment of optimum compressed data to be written in the tape medium 30 while limiting power consumption.

Even when a compression processing unit 14 is stopped by the statistical information processing unit 21, the size comparison unit 19 performs a comparison directed to operating compression processing units 14 and reports, to the access control unit 20, the smallest size, a buffer number, and an algorithm name. Accordingly, a selection of compressed data made by the access control unit 20 is not virtually affected by whether or not there is a compression processing unit 14 that has been stopped.

The access control unit 20 instructs a compression processing unit 14 to perform a compression process and receives a report that a compression process has been completed (or completion report) from a compression processing unit 14 that performed the compression process. Accordingly, for each compression processing unit 14 to which the access control unit 20 has given an instruction to perform a compression process, the access control unit 20 counts a time period from the issuance of the instruction to the reception of the completion report as a compression time that was required for the compression process. The counted compression time is reported to the statistical information processing unit 21 together with compressibility.

Compressibility (%) is calculated by formula (1). Data volume before compression is the size of a block 12*a*, and this size is fixed. Data volume (or size) of the block 12*a* after compression is reported from the size comparison unit 19. As a result, the access control unit 20 calculates compressibility using the smallest size reported from the size comparison unit 19.

Even when a pattern is extracted, this extracted pattern does not necessarily continue. Accordingly, in the present embodiment, when one or more of the compression processing units 14 are stopped in conformity with an extracted pattern, a compression time and compressibility are used as information to determine whether or not the stopping of the one or more of the compression processing units 14 in conformity with the pattern should be continued.

More particularly, in the present embodiment, an average value of compressibility and an average value of compression times for a defined number of times just before stopping one or more compression processing units 14 are calculated, and the average value of compressibility divided by the average value of the compression times (=average value of compressibility/average value of compression times) is calculated as a reference value. The compressibility and the compression times used to calculate the reference value are associated with the compression processing unit 14 with selected compressed data. A range determined in advance and including the reference value calculated in this way is a permissible range. Accordingly, in the present embodiment, when one or more compression processing units 14 are stopped, the value of the compressibility specific to the compression processing unit 14 with selected compressed data divided by a compression time is calculated, and it is confirmed whether or not the calculated value is within the permissible range. When the calculated value is not within the permissible range, all of the compression processing units 14 that have been stopped are operated. The permissible range will hereinafter be referred to as a "reference range".

As long as a data characteristic of a block 12*a* to be compressed does not change a relatively large amount, it is considered that the reference value calculated as described above will not change remarkably. Accordingly, the reference value is an index to determine the extent of a change in a data characteristic. In the present embodiment, the reference range is from 20% above the reference value to 10% below the reference value.

As compressibility becomes higher, or as a compression time becomes shorter, the value of compressibility divided by a compression time becomes higher. In data compression, compressibility is desirably high, and a compression time is desirably short. The value of compressibility divided by a compression time will hereinafter be referred to as an "efficiency value".

In the present embodiment, by calculating the efficiency value, both compressibility and a compression time are reflected in a selection of compressed data (algorithm). However, a selection of compressed data may be made in consideration of only one of the compressibility and the compression time. Alternatively, as an example, an upper limit of a compression time may be set, and a piece of compressed data whose size is the smallest from among pieces of compressed data generated by compression processing units 14 with a compression time not exceeding the upper limit may be selected. This is because a content required for data compression is not always the same. As a result, to avoid a selection of compressed data with a long compression time, the number of times compressed data consecutively fails to be selected due to the length of the compression time may be adopted as a pattern for extracting a trend (regularity) present in the result of a selection of compressed data.

FIG. 5 and FIG. 6 are each a diagram illustrating a stop control applied to each compression processing unit performed by a statistical processing unit.

With reference to FIG. 5 and FIG. 6, a pattern extracted by the statistical processing unit 21 and a stop control applied to each compression processing unit 14 performed upon the pattern extraction will be specifically described.

As described above, patterns extracted by the statistical processing unit 21 include a pattern directed to only one compression processing unit 14 and a pattern directed to a plurality of compression processing units 14. FIG. 5 represents a pattern directed to only one compression processing unit 14 and an execution example of a stop control performed via extraction of the pattern. FIG. 6 represents a pattern directed to only a plurality of compression processing units 14 and an execution example of a stop control performed via extraction of the pattern.

In FIG. 5 and FIG. 6, a table including items such as "OBJECT BLOCK", "COMPRESSIBILITY", "COMPRESSION TIME", and "ALGORITHM" represents an execution example of the stop control applied to each compression processing unit 14. Each item represents the following content.

The numbers "1" to "37" in the item "OBJECT BLOCK" represent block numbers assigned to the blocks 12a as identification data. Accordingly, FIG. 5 and FIG. 6 represent a stopped compression processing unit 14 for each block 12a.

"A" to "D" in the sub items of the item "ALGORITHM" each represent an algorithm. Algorithm "A" corresponds to the compression processing unit 14A. Similarly, algorithm "B" corresponds to the compression processing unit 14B. "o" and "x" indicated in the sub items of "ALGORITHM" represent the results of selections of corresponding algorithms. "o" indicates that a corresponding algorithm has been selected, and "x" indicates that a corresponding algorithm has not been selected. The numbers indicated in the items "COMPRESSIBILITY" and "COMPRESSION TIME" represent actual compressibility and compression time at an algorithm with selected compressed data.

In addition to "o" and "x", the sub items of "ALGORITHM" indicate "STOP 1" to "STOP 6". All of "STOP 1" to "STOP 6" represent stopping of a compression processing unit 14 whose corresponding algorithm has been adopted. The numbers "1" to "6" in "STOP 1" to "STOP 6" represent, in units of blocks 12a, the length of the period during which the compression processing unit 14 is stopped. Accordingly, as an example, "STOP 1" means that a compression processing unit 14 is stopped for one block 12a. "stop 2" means that a compression processing unit 14 is stopped for two blocks 12a consecutively.

As illustrated in FIG. 5, in the present embodiment, a compression processing unit 14 (algorithm) with not-selected compressed data is stopped six times consecutively. Accordingly, since both of the compression processing units 14B and 14C by which algorithms C and D have been adopted have compressed data that is not selected at, for example, the blocks 12a having block numbers 1 to 6, both of these compression units are stopped at the block 12a having block number 7. At the block 12a having block number 24, the compression processing units 14A, 14C and 14D with compressed data that failed to be selected each time the previous six times in a row are stopped.

In the present embodiment, the upper limit of the stop period corresponds to six blocks 12a. The upper limit is set because a compression processing unit 14 that has been stopped could generate optimum compressed data upon a change in a data characteristic. Accordingly, a compression processing unit 14 after being stopped for six blocks 12a is operated again to confirm whether or not this compression processing unit 14 can generate optimum compressed data. Such a confirmation is performed during a period corresponding to two blocks 12a. A compression processing unit 14 confirmed to not have been generating optimum compressed data in the compression process corresponding to the two blocks 12a is stopped again. As a result, as an example, the compression processing units 14C and 14D (algorithms C and D), which stop compression of the blocks 12a having block numbers up to 12, compress the blocks 12a having block numbers 13 and 14. Compressed data obtained via the compressing of the two blocks is not selected at all, and hence the compression processing units 14C and 14D are stopped when the block 12a having block number 15 is compressed. For the same reason, the compression processing units 14A, 14C and 14D are stopped when the block 12a having block number 32 is compressed.

As described above, in the present embodiment, when compressed data fails to be selected each time six times in a row, a compression processing unit 14 is stopped. Accordingly, under the condition that the defined number of times for calculating the reference value above is six, the reference value may be calculated without fail while all of the compression processing units 14 are being operated.

In the present embodiment, an upper limit is set for the stop period of a compression processing unit 14, and, by operating a compression processing unit 14 that had been stopped until the upper limit of the stop period was reached, it is confirmed whether or not the compression processing unit 14 that had been stopped can generate optimum compressed data. Accordingly, while decreasing power consumption, the possibility that optimum compressed data will not be generated may be decreased.

The stopping of the compression processing units 14B to 14D (algorithms B to D) that are stopped at the time of compressing of the block 12a having block number 17 is terminated at the time of compressing of the following block 12a, and all of the compression processing units 14 are operated. This is because the compressibility specific to the compression processing unit 14A which compresses the block 12a having block number 17 is low and the efficiency value deviates from the reference range due to the low compressibility. In this case, the effective reference value is about 20 ($\approx$(apprxeq) $(200+190+200+210+200+120)/(6\times10+5)= 1120/55\approx$(apprxeq) 20), the lower limit of the effective range is about 18, and the efficiency value is 12 (=120/10).

The reason for the deviation of the calculated efficiency value from the reference range may be a change between a data characteristic of the compressed block 12a and that of another compressed block 12a that was compressed prior to this compressed block 12a. Such a change in a data characteristic could change a compression processing unit 14 (algorithm) that generates optimum compressed data. Accordingly, operating all of the compression processing units 14 that had been stopped since deviating of their calculated efficiency values from the reference range may decrease the possibility that optimum compressed data will not be generated. As illustrated in FIG. 5, compressed data generated by the compression processing unit 14B is adopted for compression of the block 12a having block number 18.

As described above, in the present embodiment, as a pattern directed to only one compression processing unit 14, the length of a period during which compressed data generated by this compression processing unit 14 continuously fails to be selected is adopted, and this adopted pattern is used for individual stop controls for compression processing units 14. Next, with reference to FIG. 6, specific descriptions will be given of a pattern directed to a plurality of compression processing units 14 and of a stop control following this pattern and directed to all of the compression processing units 14.

To compress the blocks 12a having block numbers 1 to 6, compressed data generated by the compression processing unit 14A (algorithm A) and compressed data generated by the compression processing unit 14B (algorithm B) are selected in an alternating pattern. Upon such selecting, the compression processing units 14C and 14D (algorithms C and D) are stopped during the compression period of the blocks 12a having block numbers 7 to 12. During this compression period, compressed data generated by the compression processing unit 14A (algorithm A) and compressed data generated by the compression processing unit 14B (algorithm B) are selected in an alternating pattern, as is done in compressing the blocks 12a having block numbers 1 to 6. In the present embodiment, as a pattern directed to a plurality of compression processing units 14, a pattern is adopted in which pieces of compressed data generated by two compression processing units 14 are consecutively selected in an alternating pattern a predetermined number of times, i.e., six times. Accordingly, during the compression period of the blocks 12a having block numbers 13 to 24, the compression processing units 14C and 14D are stopped consecutively and the compression processing units 14A and 14B are stopped in an alternating pattern in accordance with the pattern.

In the present embodiment, the upper limit of the period during which the stop control following a pattern is performed corresponds to twelve blocks 12a. Such an upper limit of the period is set because there is a possibility that a compression processing unit 14 that had been stopped can generate optimum compressed data due to a change in a data characteristic. Accordingly, after the stopping for twelve blocks 12a, all of the compression processing units 14 are operated to confirm whether or not a stop control following a pattern should be continued.

The confirmation is made during a period corresponding to four blocks 12a. When it is confirmed in the compression process corresponding to four blocks 12a that compressed data has been selected in accordance with a pattern, a stop control including the period whose upper limit corresponds to twelve blocks 12a is performed again. Meanwhile, when it is confirmed that compressed data has not been selected in accordance with the pattern, the continuation of the stop control is invalidated. In the example illustrated in FIG. 6, at the time of compressing the block 12a having block number 28, compressed data generated by the compression processing unit 14A is selected. Compressed data generated by the compression processing unit 14B is not selected, and hence the continuation of the stop control is invalidated, causing all of the compression processing units 14 to compress the block 12a having block number 29. Although not illustrated in FIG. 6, as soon as the efficiency value deviates from the reference range, all of the compression processing units 14 are operated.

As described above, in the present embodiment, as a pattern directed to a plurality of compression processing units 14, a pattern of a selection of pieces of compressed data generated by two compression processing units 14 is adopted; the adopted pattern is used for the stop control for the entirety of the set of the compression processing units 14. However, a pattern to be adopted may be a pattern of a selection of pieces of compressed data generated by more than two compression processing units 14. When there is a regularity, a more complicated pattern may be adopted.

In the present embodiment, to achieve a stop control following a pattern directed to a plurality of compression processing units 14, a management directed to all of the compression processing units 14 is performed. A state as a target of this management will hereinafter be referred to as a "phase". The phase includes a "pattern phase" for stopping each compression processing unit 14 in accordance with a pattern, a "pattern continuation determination phase" for determining whether or not the pattern phase should be continued, and a "preparation phase" other than these phases.

In the present embodiment, to perform a stop control individually for the compression processing units 14 as illustrated in FIG. 5, the compression processing units 14 are also managed individually. A state as a target of the management will hereinafter be referred to as a "mode". The mode includes a stop mode in which a compression processing unit 14 is stopped, a stop continuation determination mode for determining whether or not the stop mode should be continued, a "pattern mode" that is set at the time of the pattern phase, and a preparation mode. The preparation mode is a mode that is set at the time of the preparation phase and that is neither the stop mode nor the stop continuation determination mode.

FIG. 2 illustrates a configuration of a statistical information processing unit.

As illustrated in FIG. 2, the statistical processing unit 21 includes a reference information holding unit 110, a statistical information holding unit 120, a state determination unit 130, a compression apparatus management unit 140, and a state holding unit 150.

The reference information holding unit 110 is used to save compressibility and a compression time transmitted for each block 12a from the access control unit 20. The reference information holding unit 110 also saves compressibility for a defined number of times and a reference value calculated from a compression time.

The statistical information holding unit 120 is used to save an algorithm name of a compression processing unit 14 with compressed data selected by the access control unit 20. At least as many algorithm names as are required to extract a pattern are saved.

As described above, in the present invention, the entirety of a set of the compression processing units 14 is managed by a phase, and a mode is used to individually manage the compression processing units 14. The state holding unit 150 is used to save data for the managements. The state holding unit 150 saves data on, for example, the length of the continuation period during which the pattern phase continues (or the number of executions) and the length of the stop period during which each compression processing unit 14 is stopped (or the number of executions).

The state determination unit 130 references respective data stored in the reference information holding unit 110 and the statistical information holding unit 120, determines a phase to be set for the entirety of the set of the compression processing units 14 and modes to be set for individual compression processing units 14, and makes a setting in accordance with the result of the determination. Various data saved in the state holding unit 150 are updated by the state determination unit 130.

The state determination unit 130 specifies (decides) a compression processing unit 14 to be stopped from among the compression processing units 14. In accordance with decisions made by the state determination unit 130, the compression apparatus management unit 140 stops a compression processing unit 14 to be stopped. For each compression processing unit 14, the stopping and the operating are achieved in accordance with an instruction to the power supply control unit 15. As a result, a stop control for stopping the compression processing units 14 is achieved as illustrated in FIG. 5 and FIG. 6.

Figure 7:
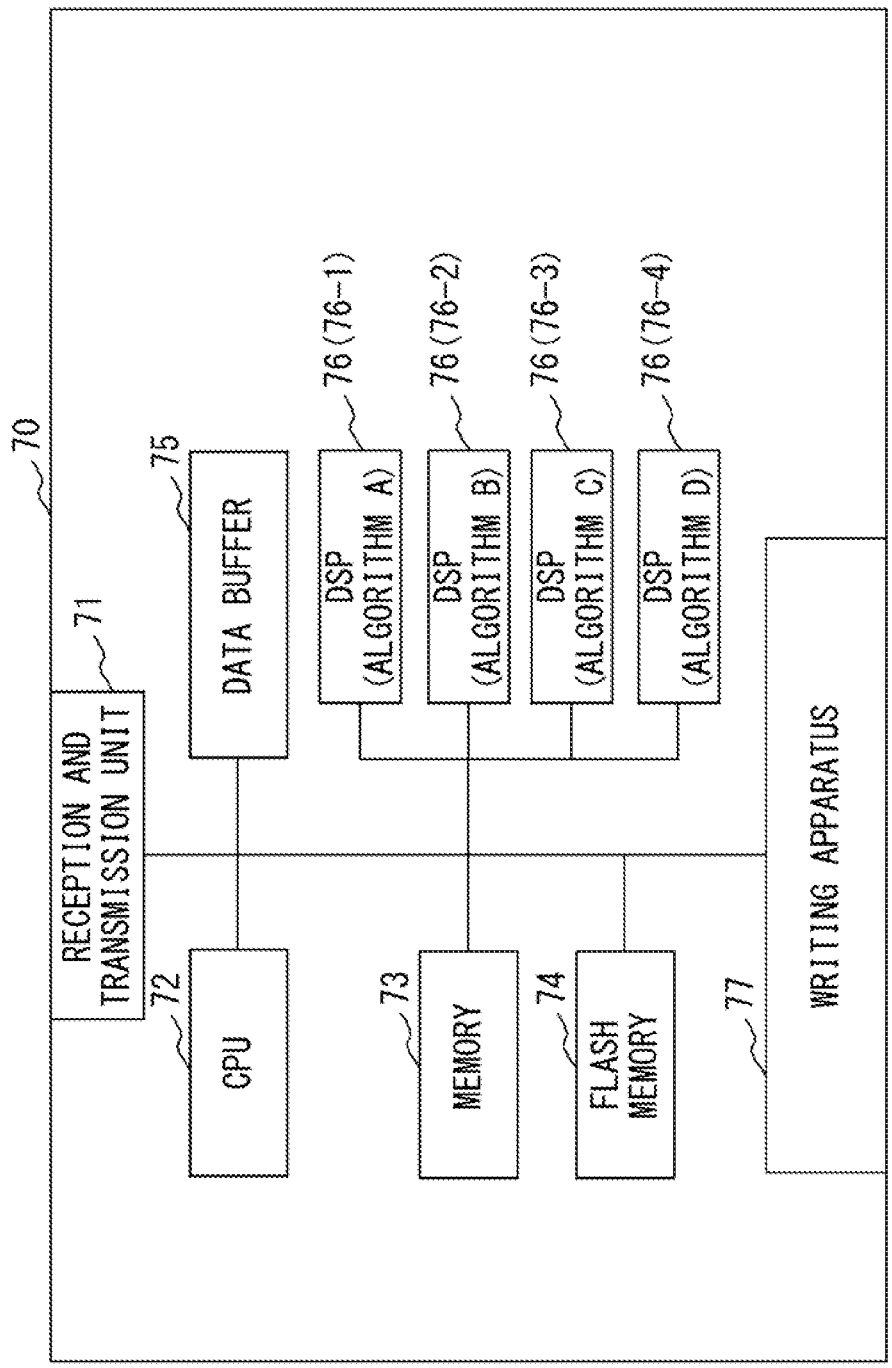
FIG. 7 illustrates an example of a hardware configuration of a data storage apparatus to which the present embodiment is applicable.

FIG. 7 illustrates an example of a hardware configuration of a data storage apparatus to which the present embodiment is applicable.

An example of a hardware configuration of a data storage apparatus 70 to which the present embodiment is applicable will be specifically described with reference to FIG. 7.

As illustrated in FIG. 7, the data storage apparatus 70 to which the present embodiment is applicable includes a transmission and reception unit 71, a CPU (Central Processing Unit) 72, a memory 73, a flash memory 74, a data buffer 75, four DSPs (Digital Signal Processors) 76 (76-1 to 76-4), and a writing apparatus 77.

The transmission and reception unit 71 is a communication apparatus that transmits and receives data via a network. The data transmission and reception processing unit 11 illustrated in FIGS. 1A and 1B corresponds to the transmission and reception unit 71.

The tape medium 30 illustrated in FIGS. 1A and 1B may be, for example, attachable to and detachable from the writing apparatus 77, and, in accordance with an instruction from the CPU 71, the writing apparatus 77 causes data stored in the data buffer 75 to be stored in the tape medium 30. To perform a process in accordance with an instruction from the CPU 71, the writing apparatus 77 includes a controller that controls the entirety of the writing apparatus 77. This controller corresponds to, for example, the access unit 18 illustrated in FIGS. 1A and 1B.

The memory 73 is used in a task by, for example, the CPU 72, and the flash memory 74 stores a program executed by the CPU 71. The CPU 71 reads a program stored in the flash memory 74, loads this program into the memory 73 and executes it The received data 12 received by the transmission and reception unit 71 is, for example, stored in the memory 73 and divided into blocks 12a by the CPU 72. Accordingly, the data dividing processing unit 13 illustrated in FIGS. 1A and 1B is achieved by, for example, the CPU 72, the memory 73, and the flash memory 74.

The DSPs 76-1 to 76-4 correspond to the compression processing units 14A to 14D, respectively. In accordance with an instruction from the CPU 72, the DSPs 76 read and compress blocks 12a stored in, for example, the memory 73, and store compressed data in a specified region of the data buffer 75. Accordingly, the buffer unit 16 illustrated in FIGS. 1A and 1B corresponds to the data buffer 75.

The size comparison unit 19, the access control unit 20, and the statistical information processing unit 21 illustrated in FIGS. 1A and 1B are also achieved by, for example, the CPU 72, the memory 73, and the flash memory 74. In FIG. 2, the reference information holding unit 110, the statistical information holding unit 120, and the state holding unit 150 correspond to, for example, the memory 73. The state determination unit 130 and the compression apparatus management unit 140 are achieved via the CPU 72 reading a program stored in the flash memory 74, loading this program into the memory 73, and executing it.

The hardware configuration illustrated in FIG. 7 is an example, and the data storage apparatus 70 to which the present embodiment is applicable is not limited to the configuration illustrated in FIG. 7. As an example, the DSPs 76 correspond to the compression processing units 14, but, instead of the DSPs 76, a CPU or an attachable and detachable module apparatus provided with a CPU (e.g., an apparatus operated as one computer) may be adopted.

The state determination unit 130 and the compression apparatus management unit 140 are achieved via, for example, the CPU 72 executing the following process. Next, with reference to FIGS. 3A, 3B and 4, a process for achieving the state determination unit 130 and the compression apparatus management unit 140 will be described in detail.

Figure 3A:
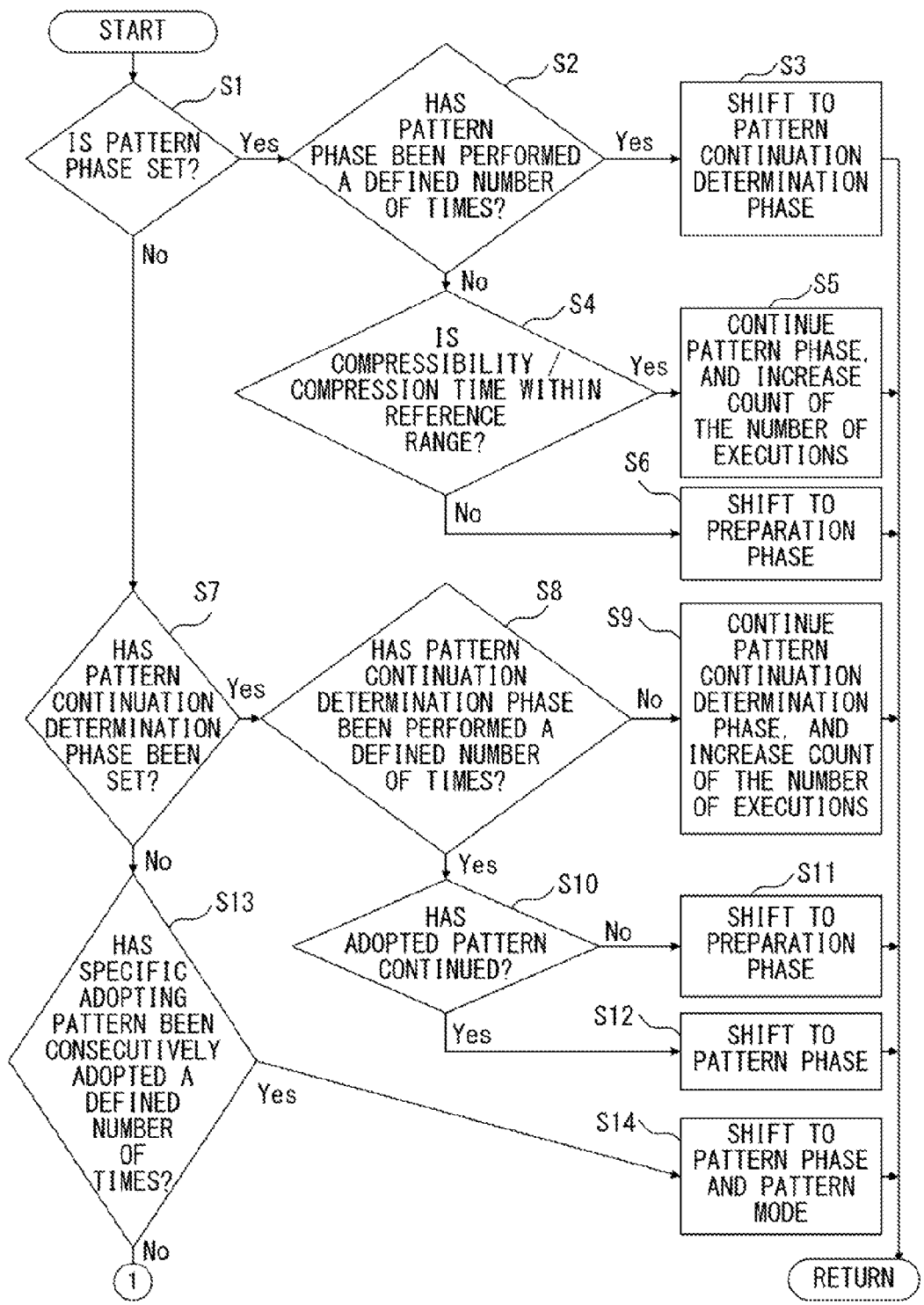
FIGS. 3A and 3B are a flowchart of a state determination process.
Figure 3B:
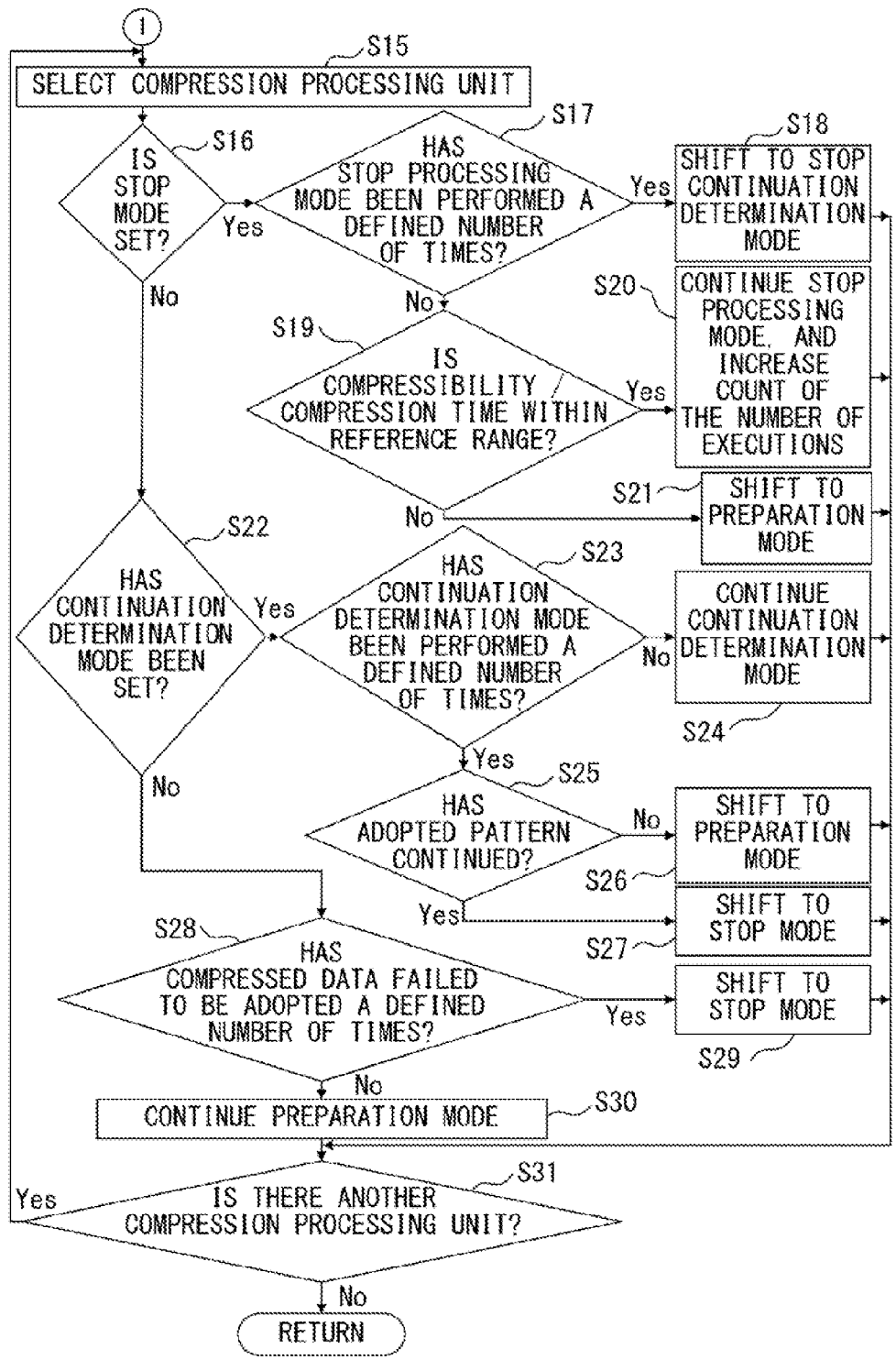

FIGS. 3A and 3B are a flowchart of a state determination process.

The state determination process is a process for determining and setting the state (or phase) of the entirety of a set of the compression processing units 14 and for individually determining and setting the states (or modes) of the compression processing units 14. The state determination unit 130 illustrated in FIG. 2 is achieved via the CPU 72 performing the state determination process.

The state determination process is achieved via the CPU 72 reading a subprogram stored in the flash memory 74, loading this subprogram into the memory 73, and executing it. The state determination process is executed after, for example, a selection of compressed data to be written in the tape medium 30 is finished. Data for management of a phase, data for management of a mode, data for management of the respective lengths of the periods during which the phase and the mode are continued, and the like are stored in the memory 73 as described above.

First, the CPU 72 determines whether or not a pattern phase is currently set (S1). When the pattern phase is currently set, the determination in S1 indicates a judgment of "yes" and the process shifts to S2. When the pattern phase is not set, the determination in S1 indicates a judgment of "no" and the process shifts to S7.

As illustrated in FIG. 6, under the condition that the upper limit of the compression period corresponds to twelve blocks 12a, the pattern phase shifts to a pattern continuation determination phase after the passage of the compression period. In S2, the CPU 72 determines whether or not the pattern phase has been performed the defined number of times, twelve times (corresponding to twelve blocks 12a). Accordingly, when compression corresponding to twelve blocks 12a is performed in the pattern phase, a judgment of "yes" is indicated in S2, the pattern phase shifts to a pattern continuation determination phase, and 0 is set as the number of executions, which is data for counting the length of a setting period during which the phase is set (S3). The process then shifts to S31. Meanwhile, when compression corresponding to twelve blocks 12a is not performed in the pattern phase, a judgment of "no" is indicated in S2 and the process shifts to S4.

In S4, the CPU 72 determines whether or not an efficiency value, compressibility divided by a compression time, is within a reference range. When the efficiency value is within the reference range, a judgment of "yes" is indicated in S4 and the count of the aforementioned number of executions is increased, i.e., incremented, while maintaining the pattern phase (S5). The process then shifts to S31. Meanwhile, when the efficiency value is not within the reference range, a judgment of "no" is indicated in S4 and the pattern phase shifts to a preparation phase (S6). The process then shifts to S31.

In S7, the CPU 72 determines whether or not the pattern continuation determination phase has been set. When the pattern continuation determination phase is set, a judgment of "yes" is indicated in S7 and the process shifts to S8. When the pattern continuation determination phase is not set, i.e., when the preparation phase is set, a judgment of "no" is indicated in S7 and the process shifts to S13.

As with the pattern phase, the pattern continuation determination phase is a phase that is set under the condition that the upper limit of the compression period determined in advance corresponds to twelve blocks 12a. Accordingly, in S8, the CPU 72 determines whether or not the pattern continuation determination phase has been performed a defined number of times, four times (corresponding to four blocks 12a). As a result, when compression corresponding to four blocks 12a is performed in the pattern continuation determination phase, a judgment of "yes" is indicated in S8 and the process shifts to S10. Meanwhile, when compression corresponding to four blocks 12a is not performed in the pattern continuation determination phase, a judgment of "no" is indicated in S8 and the count of the aforementioned number of executions is increased without shifting the pattern continuation phase (S9). The process then shifts to S31.

In S10, the CPU 72 determines whether or not an adopted pattern has continued. When a change in a compression processing unit 14 with compressed data selected in the pattern continuation determination phase does not follow the adopted pattern, a judgment of "no" is indicated in S10 and the pattern continuation determination phase shifts to the preparation phase (S11). The process then shifts to S31. Meanwhile, when a change in a compression processing unit 14 with compressed data selected in the pattern continuation determination phase follows the adopted pattern, a judgment of "yes" is indicated in S10, the pattern continuation determination phase shifts to the pattern phase, and 0 is set as the number of executions (S12). The process then shifts to S31.

In S13, the CPU 72 determines whether or not a specific adopting pattern has been consecutively adopted a defined number of times until just before that moment. When pieces of compressed data generated by two compression processing units 14 are selected in an alternating pattern until just before that moment a defined number of times corresponding to twelve blocks 12a as illustrated in FIG. 6, a judgment of "yes" is indicated in S13 and the pattern phase and the pattern mode are set (S14). The process then shifts to S31. When compressed data is not selected in such a manner, a judgment of "no" is indicated in S13 and the process shifts to S15.

The aforementioned processes of S1 to S14 are performed to set a phase directed to the entirety of the set of the compression processing units 14. The processes of S15 and after are performed to individually set the modes of the compression processing units 14. The process shifts to S15 only when the preparation phase is set.

First, the CPU 72 selects one of the compression processing units 14 as a processing object (S15). Next, the CPU 72 determines whether or not the mode set for the selected compression processing unit 14 is the stop mode (S16). When the stop mode is set, a judgment of "yes" is indicated in S16 and the process shifts to S17. When the stop mode is not set, a judgment of "no" is indicated in S16 and the process shifts to S22.

In S17, the CPU 72 determines whether or not compression has been performed under the stop mode a defined number of times, six times (corresponding to six blocks 12a). Accordingly, when compression corresponding to six blocks 12a is performed under the stop mode, a judgment of "yes" is indicated in S17, the stop mode shifts to the stop continuation determination mode, and 0 is set as the number of executions (S18). The process then shifts to S31. Meanwhile, when compression corresponding to six blocks 12a is not performed under the stop mode, a judgment of "no" is indicated in S17 and the process shifts to S19.

In S19, the CPU 72 determines whether or not the efficiency value is within the reference range. When the efficiency value is within the reference range, a judgment of "yes" is indicated in S19, the stop continuation determination mode shifts to the stop mode, and 0 is set as the number of executions, which is data for counting the period during which a mode continues (S20). When the efficiency value is not within the reference range, a judgment of "no" is indicated in S19 and the stop continuation determination mode shifts to the preparation mode (S21). After S20 or S21, the process shifts to S31.

In S22, the CPU 72 determines whether or not the stop continuation determination mode is set. When the stop continuation determination mode is set, a judgment of "yes" is indicated in S22 and the process shifts to S23. When the stop continuation determination mode is not set, a judgment of "no" is indicated in S22 and the process shifts to S28.

In S23, the CPU 72 determines whether or not compression has been performed under the stop continuation determination mode a defined number of times, two times (corresponding to two blocks 12a). Accordingly, when compression corresponding to two blocks 12a is performed under the stop continuation determination mode, a judgment of "yes" is indicated in S23 and the process shifts to S25. When compression corresponding to two blocks is not performed under the stop continuation determination mode, a judgment of "no" is indicated in S23 and the count of the number of executions is increased while maintaining the stop continuation determination mode (S24). The process then shifts to S31.

In S25, the CPU 72 determines whether or not an adopted pattern has continued. When compressed data is selected under the stop continuation determination mode one or more times, it is determined that the adopted pattern has not continued. Accordingly, a judgment of "no" is indicated in S25 and the stop continuation determination mode shifts to the preparation mode (S26). Meanwhile, when compressed data has never been selected under the stop continuation determination mode, it is determined that the adopted pattern has continued. As a result, a judgment of "yes" is indicated in S25, the stop continuation determination mode shifts to the stop mode, and 0 is set as the number of executions (S27). After S26 or S27, the process shifts to S31.

In S28, the CPU 72 determines whether or not compressed data has failed to be adopted (selected) a defined number of times that is required to shift to the stop mode, namely, six times (corresponding to six blocks 12a). Accordingly, when compressed data is never selected at the previous six blocks 12a, a judgment of "yes" is indicated in S28, the preparation mode shifts to the stop mode, and 0 is set as the number of executions (S29). Meanwhile, when compressed data is selected at the previous six blocks 12a one or more times, a judgment of "no" is indicated in S28 and the preparation mode continues to be set (S30). After S29 or S30, the process shifts to S31.

In S31, the CPU 72 determines whether or not there is another compression processing unit 14 that should be treated as a processing object. When all of the compression processing units 14 were processing objects, a judgment of "yes" is indicated in S31, ending the state determination process. When there is still a compression processing unit 14 that should be treated as a processing object, a judgment of "no" is indicated in S31 and the process returns to S15. Accordingly, the next compression processing unit 14 that should be treated as a processing object is selected in S15.

Although not particularly illustrated, when the process of S14 is performed or when a judgment of "no" is indicated in S31, it is determined whether or not a reference value needs to be calculated, and a process is performed for calculating a reference value (or reference range) in accordance with the result of the determination. Accordingly, the reference value (or reference range) is updated on an as-needed basis.

As described above, a phase that should be set is determined, and the phase is set in accordance with the result of the determination. If necessary, a mode is determined, and the mode is set in accordance with the result of the determination. This is because a phase is ordered higher than a mode.

Figure 4:
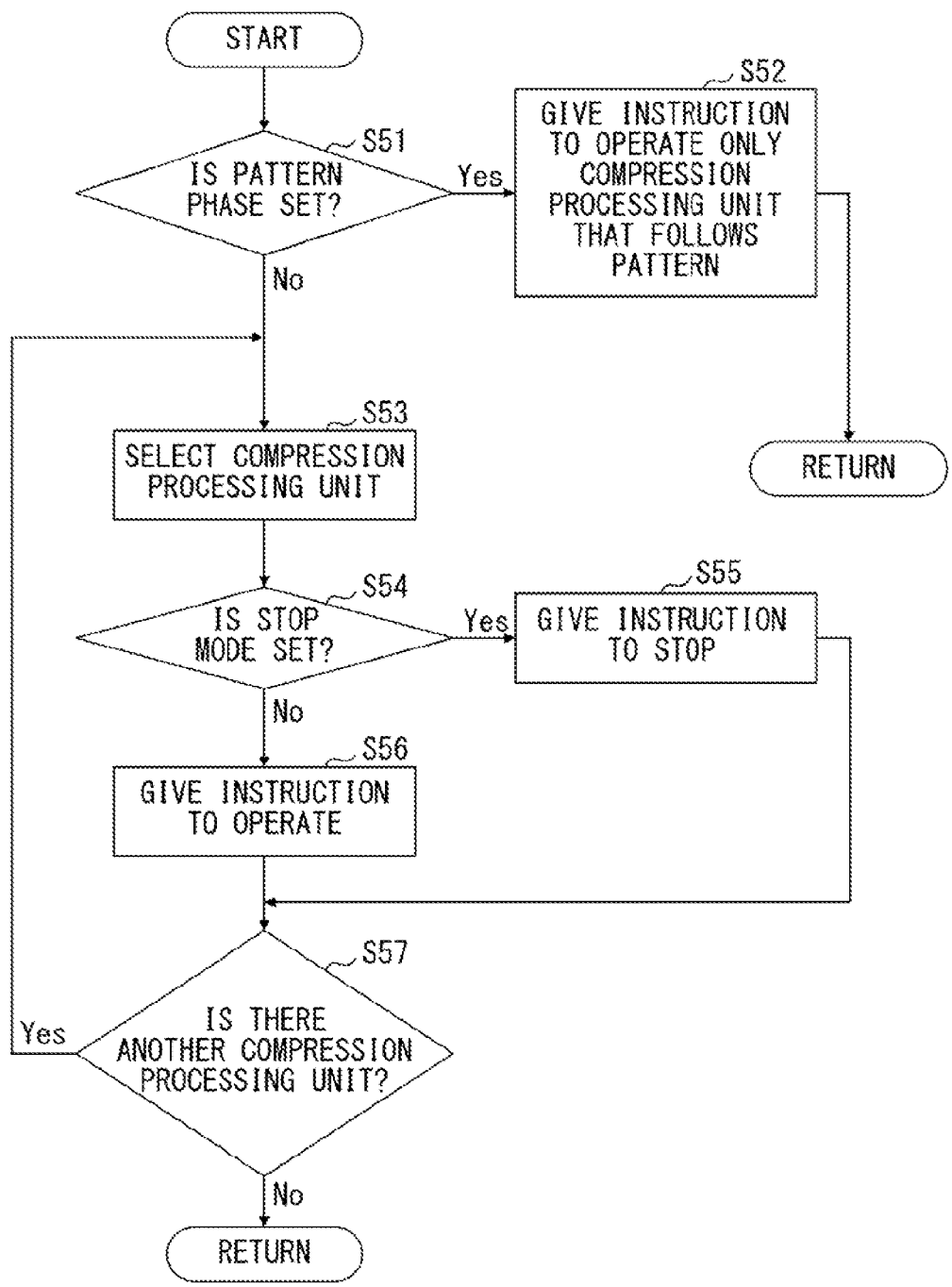
FIG. 4 is a flowchart of a compression-apparatus stopping process.

FIG. 4 is a flowchart of a compression-apparatus stopping process.

The compression-apparatus stopping process is a process for stopping a compression processing unit 14 that should be stopped from among the compression processing units 14, and the compression processing unit 14 in FIG. 2 is achieved via the CPU 72 performing the compression-apparatus management process.

The compression-apparatus management process is achieved via the CPU 72 reading a subprogram stored in the flash memory 74, loading this subprogram into the memory 73 and executing it. The compression-apparatus management process is performed after the aforementioned state determination process ends.

First, the CPU 72 determines whether or not the pattern phase is currently set (S51). When the pattern phase is currently set, a judgment of "yes" is indicated in S51 and an instruction on an operation of only one compression processing unit 14 is given in accordance with the pattern as illustrated in FIG. 6 (S52). The compression-apparatus management process then ends. When the pattern phase is not currently set, a judgment of "no" is indicated in S51 and the process shifts to S53.

In S53, the CPU 72 selects one of the compression processing units 14 as a processing object. Next, the CPU 72 determines whether or not the stop mode is set for the selected compression processing unit 14 (S54). When the stop mode is set, a judgment of "yes" is indicated in S54 and the compression processing unit 14 is instructed to stop (S55). Meanwhile, when the stop mode is not set, a judgment of "no" is indicated in S54 and the compression processing unit 14 that is the processing object is instructed to be operated (S56). After S55 or S56, the process shifts to S57.

In S57, the CPU 72 determines whether or not there is another compression processing unit 14 that should be treated as a processing object. When all of the compression processing units 14 were processing objects, a judgment of "yes" is indicated in S57, ending the compression-apparatus management process. When there is still a compression processing unit 14 that should be treated as a processing object, a judgment of "no" is indicated in S57 and the process returns to S53. Accordingly, the next compression processing unit 14 that should be treated as a processing object is selected in S53.

As described above, when the pattern phase is set, only one of the compression processing units 14 is instructed to operate, and, when the pattern phase is not set, each of the compression processing units 14 is individually instructed to operate. Accordingly, while the pattern phase is not set, each of the compression processing units 14 individually stops.

In the present embodiment, a setting period during which the stop mode is set, i.e., the number of blocks 12a at which the compression processing units 14 do not perform compression, is fixed, but the setting period may be variable. As an example, the frequency with which compressed data generated by a compression processing unit 14 is adopted (selected) may be determined for each of the compression processing units 14, changing the length of the setting period in accordance with the frequency. Making the setting period changeable in this way allows compressed data to be generated in accordance with the optimum compression pattern while limiting the power consumption more effectively. For a similar reason, the setting period during which the pattern phase is set may be variable.

Although the data compression apparatus in accordance with the present embodiment is installed in a data storage apparatus, this data compression apparatus may be achieved as one independent apparatus. An apparatus in which the data compression apparatus is installed is not limited to a data storage apparatus but may be an apparatus that performs data communication or an apparatus configuring a system that performs data communication.

Although four compression processing units 14 are provided in the present embodiment, the number of compression processing units 14 does not need to be four. A different algorithm is adopted for each of the four compression processing units 14, but the same algorithm for performing a compression process under different conditions may be adopted for two or more compression processing units 14. In a lossless algorithm, the size of a dictionary is one of the conditions.

Applying the present invention allows optimum compressed data to be obtained via compression that utilizes a plurality of types of different algorithms.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments) of the present invention have been described in detail, it should be understood that the various changes, substitutions, and alterations could be made hereto without departing from the spirit and scope of the invention.

What is claimed is:

1. A data compression apparatus that divides data to be compressed into a plurality of divided blocks and that compresses each of the divided blocks, the data compression apparatus comprising:
   a plurality of compression processing units each of which compresses a divided block to generate a compressed block in accordance with a different algorithm;
   a selection unit to select a compressed block generated by any of the plurality of compression processing units according to at least one of a size of each generated compressed block and each processing time required for compressing the divided block; and
   a control unit to stop any of the plurality of compression processing units according to a regularity when a result of a selection made by the selection unit has the regularity.

2. The data compression apparatus according to claim 1, wherein
   the regularity includes at least one of a first regularity in which compressed data generated by one of the plurality of compression processing units fails to be selected by the selection unit each time a predetermined number of times in a row and a second regularity in which pieces of compressed data generated by two or more of the plurality of compression processing units are sequentially selected in accordance with a same pattern by the selection unit, and
   in accordance with any of the first regularity and the second regularity, the control unit determines a compression processing unit to be stopped and a period during which the compression processing unit is to be stopped.

3. The data compression apparatus according to claim 2, wherein
when the second regularity is present, the control unit causes only one of the plurality of compression processing units to compress a divided block.

4. The data compression apparatus according to claim 2, wherein
when there is a compression processing unit that has been stopped in accordance with the second regularity, the control unit causes all of the compression processing units to compress the divided blocks at a timing determined in advance and causes the selection unit to select a compressed block so as to confirm whether or not the second regularity has continued.

5. The data compression apparatus according to claim 2, wherein
when there is a compression processing unit that has been stopped in accordance with one of the first and second regularities and when a result of generation of a compressed block selected by the selection unit does not meet a predetermined condition, the control unit causes all of the compression processing units that have been stopped to restart compressing of divided blocks.

6. A data compression method performed by a computer used as a data compression apparatus that divides data to be compressed into a plurality of divided blocks and that compresses each of the divided blocks, the method comprising:
causing a plurality of compression processing units, for each of which a different algorithm is adopted, to compress the divided blocks to generate compressed blocks;
selecting a compressed block generated by any of the plurality of compression processing units according to at least one of a size of each generated compressed block and each processing time required for compressing the divided block; and
stopping any of the plurality of compression processing units according to a regularity when a pattern of the selection of a compressed block has the regularity.

7. A data compression apparatus comprising:
a plurality of compression units to apply a compression process to respective common pieces of data to be compressed in accordance with a different algorithm so as to generate a plurality of pieces of compressed data;
a selection unit to select apiece of compressed data from the plurality of pieces of compressed data according to at least one of a data size of each of the plurality of generated compressed blocks and respective processing times required to generate the plurality of pieces of compressed data;
a control unit, when one or more pieces of divided data from among a divided data group obtained by dividing a certain piece of data are processed by the plurality of compression units, to stop an operation of any of the plurality of compression processing units in accordance with a pattern of the selection by the selection unit which relates to the one or more pieces of divided data, and to control and cause the operation-stopped compression processing unit to not apply a compression process to pieces of divided data included in the divided data group but not including the one or more pieces of divided data.

* * * * *